US012802647B2

(12) United States Patent
Hara et al.

(10) Patent No.: US 12,802,647 B2
(45) Date of Patent: Nov. 17, 2026

(54) DRIVE CIRCUIT, ACTIVE MATRIX SUBSTRATE, AND DISPLAY DEVICE

(71) Applicant: Sharp Display Technology Corporation, Kameyama City (JP)

(72) Inventors: Kengo Hara, Kameyama City (JP); Hajime Imai, Kameyama City (JP); Tatsuya Kawasaki, Kameyama City (JP); Yohei Takeuchi, Kameyama City (JP); Masafumi Sugino, Kameyama City (JP)

(73) Assignee: Sharp Display Technology Corporation, Kameyama City (JP)

( * ) Notice: Subject to any disclaimer, the term of this patent is extended or adjusted under 35 U.S.C. 154(b) by 0 days.

(21) Appl. No.: 19/231,827

(22) Filed: Jun. 9, 2025

(65) Prior Publication Data

US 2025/0384843 A1 Dec. 18, 2025

(30) Foreign Application Priority Data

Jun. 18, 2024 (JP) ................................. 2024-098149

(51) Int. Cl.

| | |
|---|---|
| ***G09G 3/3266*** | (2016.01) |
| ***H10D 86/40*** | (2025.01) |
| ***H10D 86/60*** | (2025.01) |

(52) U.S. Cl.

CPC ......... *G09G 3/3266* (2013.01); *H10D 86/423* (2025.01); *H10D 86/471* (2025.01); *H10D 86/60* (2025.01); *G09G 2310/0286* (2013.01); *G09G 2310/08* (2013.01)

(58) Field of Classification Search

CPC .... H10D 86/471; H10D 86/60; H10D 86/423; G09G 3/3266

See application file for complete search history.

(56) References Cited

U.S. PATENT DOCUMENTS

| | | | | |
|---|---|---|---|---|
| 10,170,484 | B1 * | 1/2019 | Sung | H10D 84/8311 |
| 11,830,454 | B2 | 11/2023 | Hara et al. | |
| 2019/0172843 | A1 * | 6/2019 | Yoshida | G02F 1/1368 |
| 2022/0406942 | A1 * | 12/2022 | Kikuchi | H10D 86/427 |
| 2023/0082769 | A1 * | 3/2023 | Ito | H10D 86/423 257/40 |

* cited by examiner

*Primary Examiner* — Sardis F Azongha
(74) *Attorney, Agent, or Firm* — ScienBiziP, P.C.

(57) ABSTRACT

A unit circuit of a gate drive circuit includes a transistor T2 that receives a set signal and a transistor T3 that receives a reset signal. At least one of the transistors T2 and T3 includes a first channel and a second channel. A length of the second channel is longer than a length of the first channel, or a width of the second channel is narrower than a width of the first channel, or mobility of a second semiconductor layer of the transistor T2 is lower than mobility of a first semiconductor layer of the transistor T2.

13 Claims, 32 Drawing Sheets

T202 (T203)

T2 (T3)

T2 (T3)

T202 (T203)

FIRST COMPARATIVE EXAMPLE

T302 (T303)

T322 (T332)

T402

DRIVE CIRCUIT, ACTIVE MATRIX SUBSTRATE, AND DISPLAY DEVICE

CROSS-REFERENCE TO RELATED APPLICATIONS

This application claims the benefit of priority to Japanese Patent Application Number 2024-098149 filed on Jun. 18, 2024. The entire contents of the above-identified application are hereby incorporated by reference.

BACKGROUND

Technical Field

The disclosure relates to a drive circuit, an active matrix substrate, and a display device.

A shift register described in U.S. Pat. No. 11,830,454 includes a plurality of unit circuits. Each of the plurality of unit circuits includes a node, a first transistor, a second transistor, and a third transistor. A set signal is supplied to a gate terminal of the first transistor. The node is connected to a source terminal of the first transistor. A power supply potential higher than a low level potential of the set signal is supplied to a drain terminal of the first transistor. The node is connected to a gate terminal of the second transistor. A gate bus line is connected to a source terminal of the second transistor. A clock signal is supplied to a drain terminal of the second transistor. A reset signal is supplied to a gate terminal of the third transistor. The node is connected to a source terminal of the third transistor. A power supply potential higher than a low level potential of the reset signal is supplied to a drain terminal of the third transistor. Only the first transistor among the first to third transistors has a tandem structure. The tandem structure is a structure in which a first channel overlapping with a first gate electrode and a second channel overlapping with a second gate electrode are provided in a semiconductor located between a source terminal and a drain terminal. Dimensions (length and width) of the first channel are equal to dimensions (length and width) of the second channel. A material of the semiconductor constituting the first channel is the same as a material of the semiconductor constituting the second channel.

SUMMARY

Since the tandem structure has a function similar to that of a structure in which a plurality of transistors are connected in series, a voltage applied per channel (source-drain voltage) in the first transistor described in U.S. Pat. No. 11,830,454 is reduced. Here, in the description in U.S. Pat. No. 11,830,454, the dimensions (length and width) of the first channel are equal to the dimensions (length and width) of the second channel, and the material of the semiconductor constituting the first channel is the same as the material of the semiconductor constituting the second channel. However, the inventors have found that when a potential difference is actually generated between the source terminal and the drain terminal of the first transistor, the source-drain voltage (potential difference between both ends) of the first channel is different from the source-drain voltage (potential difference between both ends) of the second channel. Therefore, even when the first transistor has a tandem structure, the source-drain voltage of one of the first channel and the second channel becomes large, which requires the first transistor to have a high withstand voltage and causes the first transistor to deteriorate more quickly.

Thus, the disclosure has been made to solve the problems described above, and aims to provide a drive circuit, an active matrix substrate, and a display device that can reduce a withstand voltage required for a transistor and slow down a rate of deterioration of the transistor.

In order to solve the above problems, a drive circuit according to a first aspect is a drive circuit including a plurality of stages and configured to supply a drive signal to a group of scanning signal lines in response to an input of a clock signal, the drive circuit includes a plurality of unit circuits, each of the plurality of unit circuits constituting one stage of the plurality of stages and outputting the drive signal to a scanning signal line of the group of scanning signal lines, in which each of the plurality of unit circuits includes a node, a first transistor configured to output the drive signal to the scanning signal line, the first transistor including a gate electrode connected to the node, a source electrode being applied with the clock signal, and a drain electrode connected to the scanning signal line, a second transistor configured to receive a set signal for each of the plurality of unit circuits, the second transistor including a gate electrode configured to receive the set signal and a drain electrode connected to the node, and a third transistor configured to receive a reset signal for each of the plurality of unit circuits, the third transistor including a gate electrode configured to receive the reset signal and a drain electrode connected to the node, at least one of the second transistor and the third transistor includes a first semiconductor portion connected to the drain electrode of at least one of the second transistor and the third transistor, and a second semiconductor portion connected to the source electrode of at least one of the second transistor and the third transistor, the gate electrode of at least one of the second transistor and the third transistor includes a first gate portion overlapping the first semiconductor portion, and a second gate portion overlapping the second semiconductor portion, at least one of the second transistor and the third transistor includes a first channel being a portion of the first semiconductor portion overlapping with the first gate portion, and a second channel being a portion of the second semiconductor portion overlapping with the second gate portion, and in a plan view, in a case where a direction from the drain electrode to the source electrode is defined as a first direction and a direction orthogonal to the first direction is defined as a second direction, a length of the second channel in the first direction is longer than a length of the first channel in the first direction, or a length of the second channel in the second direction is shorter than a length of the first channel in the second direction, or mobility of electrons or holes in the second semiconductor portion is lower than mobility of electrons or holes in the first semiconductor portion.

An active matrix substrate according to a second aspect includes the drive circuit according to the first aspect and a substrate on which the drive circuit is located.

A display device according to a third aspect includes the drive circuit according to the first aspect, a substrate on which the drive circuit is located, and a counter substrate located facing the substrate.

According to the above configuration, the withstand voltage required for the transistor can be reduced and the rate of deterioration of the transistor can be slowed down.

BRIEF DESCRIPTION OF DRAWINGS

The disclosure will be described with reference to the accompanying drawings, wherein like numbers reference like elements.

FIG. 22 is a cross-sectional view illustrating a configuration of the transistor T321 of the transistor T302 according to the third embodiment.

FIG. 24 is a cross-sectional view illustrating a configuration of the transistor T321 of the transistor T302 according to the third embodiment.

FIG. 26 is a cross-sectional view illustrating a configuration of the transistor T321 of the transistor T302 according to the third embodiment.

FIG. 28 is a cross-sectional view illustrating a configuration of the transistor T321 of the transistor T302 according to the third embodiment.

FIG. 30 is a cross-sectional view illustrating a configuration of the transistor T321 of the transistor T302 according to the third embodiment.

DESCRIPTION OF EMBODIMENTS

Figure 1:
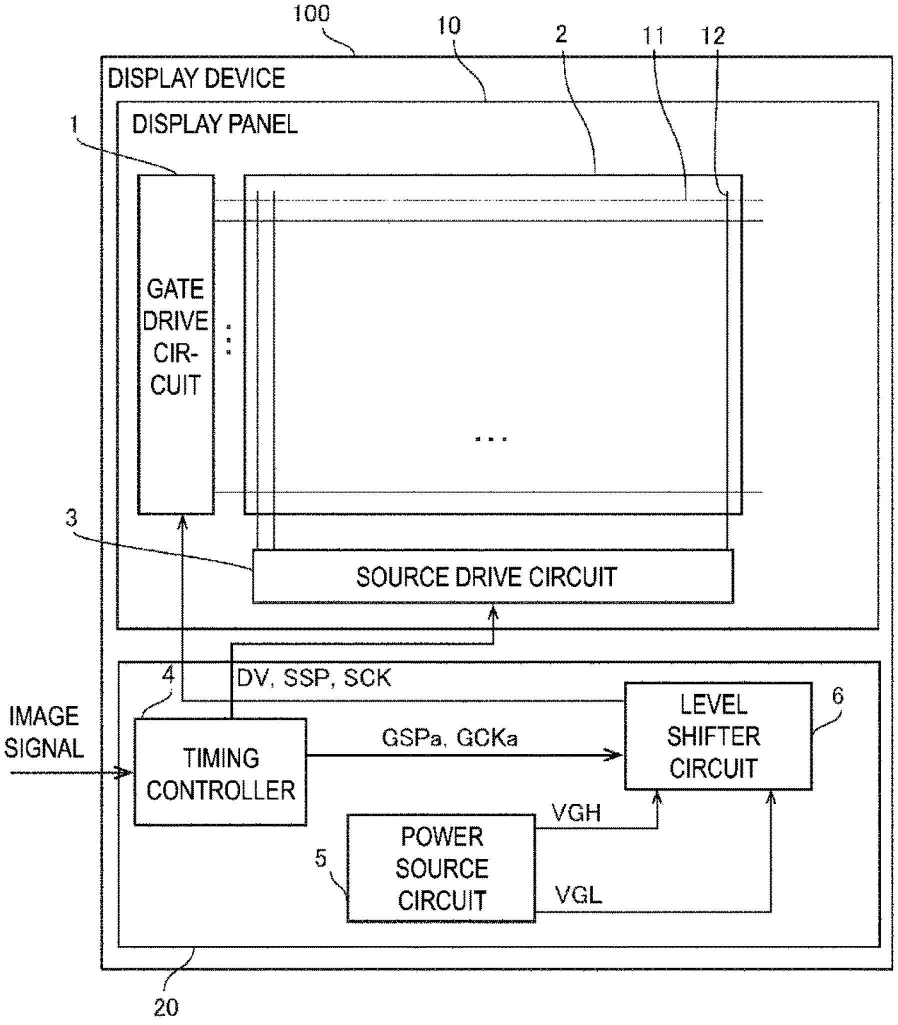
FIG. 1 is a block diagram illustrating a configuration of a display device 100 in a first embodiment.

Embodiments of the disclosure will be described below with reference to the drawings. Note that the disclosure is not limited to the following embodiments, and appropriate design changes can be made within a scope that satisfies the configuration of the disclosure. In the description below, the same reference signs are used in common among the different drawings for portions having the same or similar functions, and repeated description thereof will be omitted. Further, the configurations described in the embodiments and the modified examples may be combined or modified as appropriate within a range that does not depart from the gist of the disclosure. For ease of explanation, in the drawings referenced below, the configuration is simplified or schematically illustrated, or a portion of the components is omitted.

First Embodiment

Overall Configuration of Display Device

Figure 2:
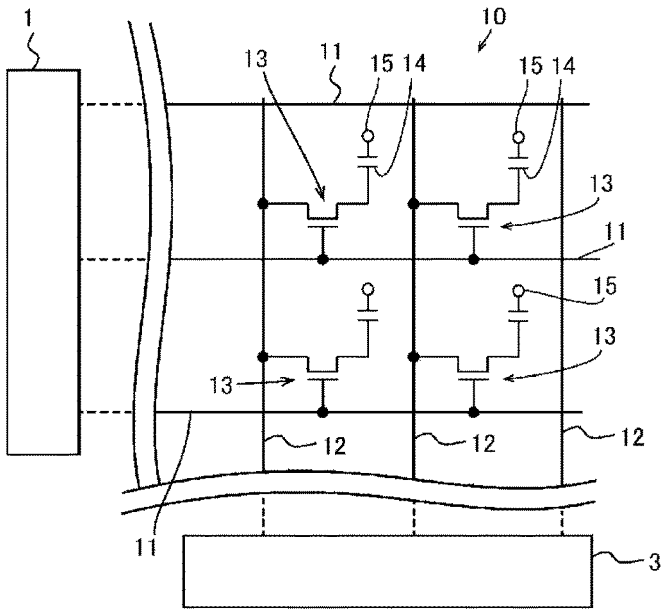
FIG. 2 is a block diagram illustrating a configuration in a display panel 10.
Figure 3:
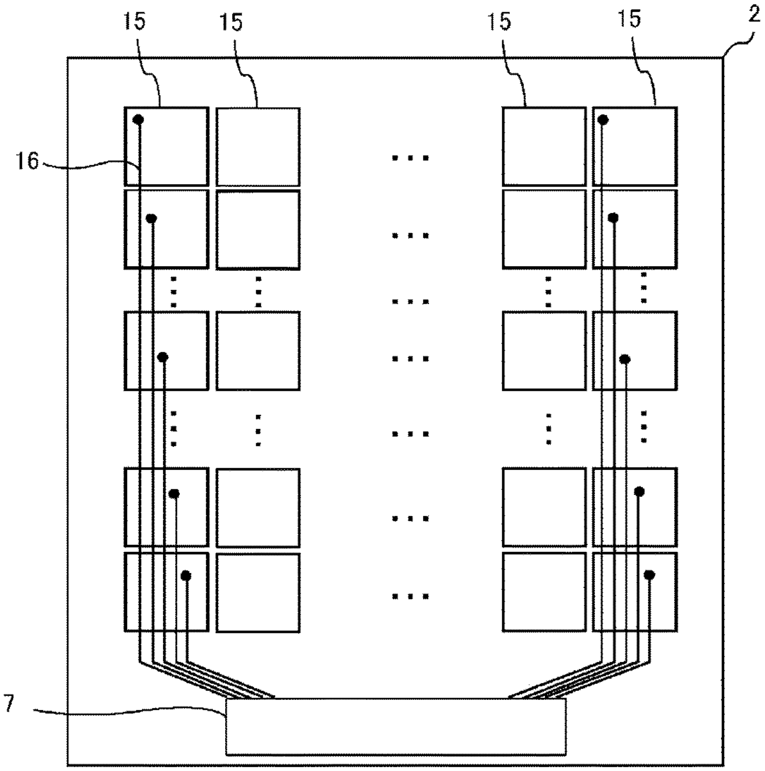
FIG. 3 is a schematic view illustrating an arrangement of common electrodes.
Figure 4:
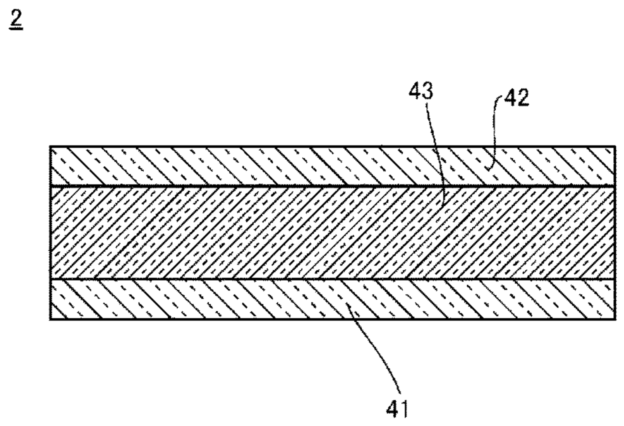
FIG. 4 is a cross-sectional view illustrating a configuration of a display portion 2.

FIG. 1 is a block diagram illustrating a configuration of a display device 100 in a first embodiment. FIG. 2 is a block diagram illustrating a configuration in a display panel 10. FIG. 3 is a schematic view illustrating an arrangement of common electrodes. FIG. 4 is a cross-sectional view illustrating a configuration of a display portion 2.

The display device 100 according to the first embodiment is configured as a display device with a touch panel. As illustrated in FIG. 1, the display device 100 includes the display panel 10 (touch panel) and a control board 20. The display panel 10 and the control board 20 are connected via a flexible printed circuit board or the like. The display panel 10 includes a gate drive circuit 1, a display portion 2, which is a region where an image is displayed, and a source drive circuit 3. The control board 20 is provided with a timing controller 4, a power source circuit 5, and a level shifter circuit 6.

As illustrated in FIG. 1, the timing controller 4 receives timing signals (a horizontal synchronization signal, a vertical synchronization signal, a data enable signal, etc.) and image signals, and generates a digital video signal DV, a source start pulse signal SSP, a source clock signal SCK, a gate start pulse signal GSPa, and a gate clock signal GCKa based on the received signals. The timing controller 4 transmits the digital video signal DV, the source start pulse signal SSP, and the source clock signal SCK to the source drive circuit 3. The timing controller 4 also transmits the gate start pulse signal GSPa and the gate clock signal GCKa to the level shifter circuit 6.

The power source circuit 5 generates a gate-on voltage VGH and a gate-off voltage VGL based on power input from an external power source or a battery (not illustrated). The gate-on voltage VGH and the gate-off voltage VGL are voltages each having constant DC levels (voltage values). The power source circuit 5 inputs the generated gate-on voltage VGH and gate-off voltage VGL to the level shifter circuit 6.

Based on the gate-on voltage VGH and the gate-off voltage VGL, the level shifter circuit 6 generates clock signals GCK1 and GCK2 and a VTP signal that has the same potential as the gate-on voltage VGH (hereinafter referred to as "high level") during a touch detection period, which is a period for detecting a touch by a pointer, and has the same potential as the gate-off voltage VGL (hereinafter referred to as "low level") during periods other than the touch detection period, including a display period. The level shifter circuit 6 inputs the generated signals to the gate drive circuit 1. The clock signal GCK2 is a signal having a phase shifted by 180° from a phase of the clock signal GCK1. The timing controller 4 performs a process of repeating the display period and the touch detection period in a time division manner.

As illustrated in FIG. 2, the gate drive circuit 1 is located on one side of the display portion 2. The gate drive circuit 1 is a gate driver on array (GOA) formed on an active matrix substrate 41 (see FIG. 4) of the display panel 10.

The display panel 10 is provided with a plurality of gate lines 11 constituting a group of scanning signal lines connected to the gate drive circuit 1 and a plurality of source lines 12 constituting a group of source signal lines connected to the source drive circuit 3. The plurality of gate lines 11 and the plurality of source lines 12 are arranged to intersect with each other, and pixels are located in regions divided by the plurality of gate lines 11 and the plurality of source lines 12, respectively. The plurality of pixels are arrayed in a matrix in the display panel 10.

As illustrated in FIG. 2, a pixel is provided with a pixel transistor 13 and a pixel electrode 14. A gate electrode of the pixel transistor 13 is connected to the gate line 11. A source electrode of the pixel transistor 13 is connected to the source line 12. A drain electrode of the pixel transistor 13 is connected to the pixel electrode 14.

When the pixel transistor 13 is turned on by a drive signal (gate signal) supplied via the gate line 11, a source signal supplied via the source line 12 is written (charged) to the pixel electrode 14. Thus, an electrical field is formed between the pixel electrode 14 and a common electrode 15 located facing the pixel electrode 14.

The plurality of common electrodes 15 are disposed in a matrix shape, for example, as illustrated in FIG. 3. A touch detection control circuit 7 is connected to the plurality of common electrodes 15 through corresponding wiring lines 16. Electrostatic capacitance of the common electrodes 15 changes due to capacitive coupling between the common electrodes and the pointer. The touch detection control circuit 7 supplies touch drive signals (pulse signals) to the plurality of common electrodes 15 during a touch detection period TP (see FIG. 10). A waveform of the pulse signal changes depending on the magnitude of the electrostatic capacitance of the common electrodes 15. The touch detection control circuit 7 detects a touch of the pointer (touched position) based on the waveform of the pulse signal from the common electrode 15. That is, the common electrodes 15 also serve as touch detection electrodes. The display panel 10 is a self-capacitive touch panel. Note that, not limited to this example, the display panel 10 may be configured as a mutual-capacitive touch panel.

As illustrated in FIG. 4, the display portion 2 includes the active matrix substrate 41, a counter substrate 42 located facing the active matrix substrate 41, and a liquid crystal layer 43 located between the active matrix substrate 41 and the counter substrate 42. The liquid crystal layer 43 is driven by an electrical field generated between the pixel electrode 14 and the common electrode 15 to display an image on the display panel 10.

Configuration of Gate Drive Circuit 1

Figure 5:
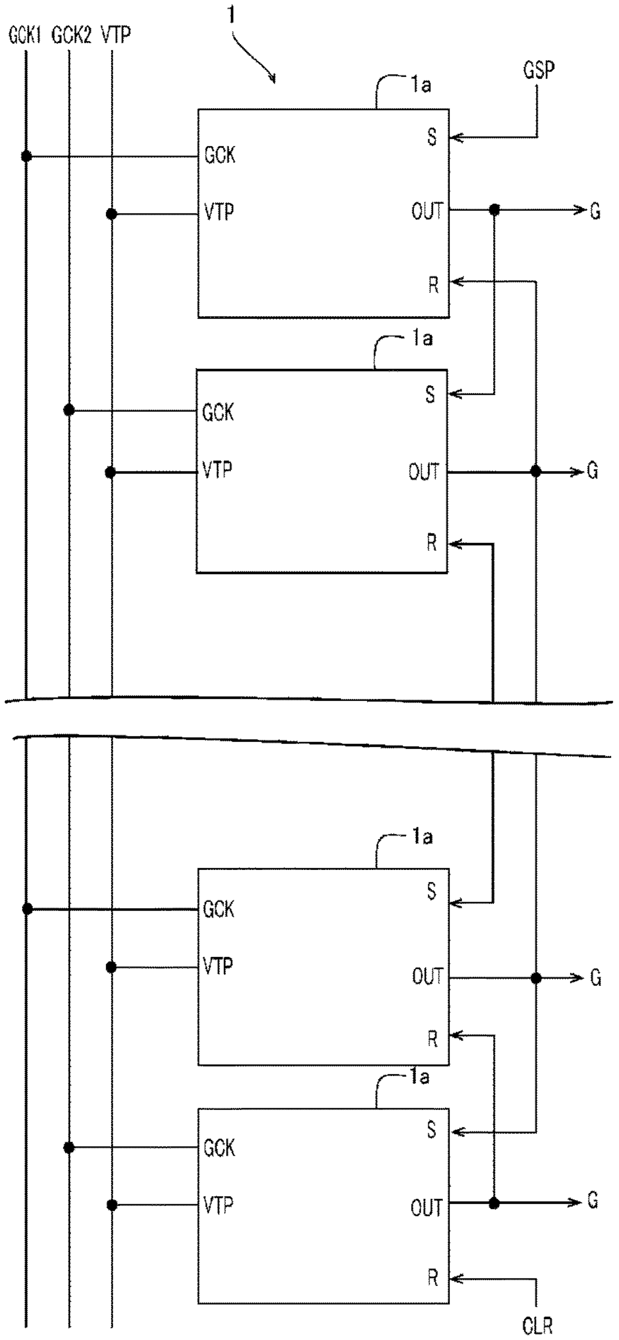
FIG. 5 is a diagram illustrating a configuration of a gate drive circuit 1.
Figure 6:
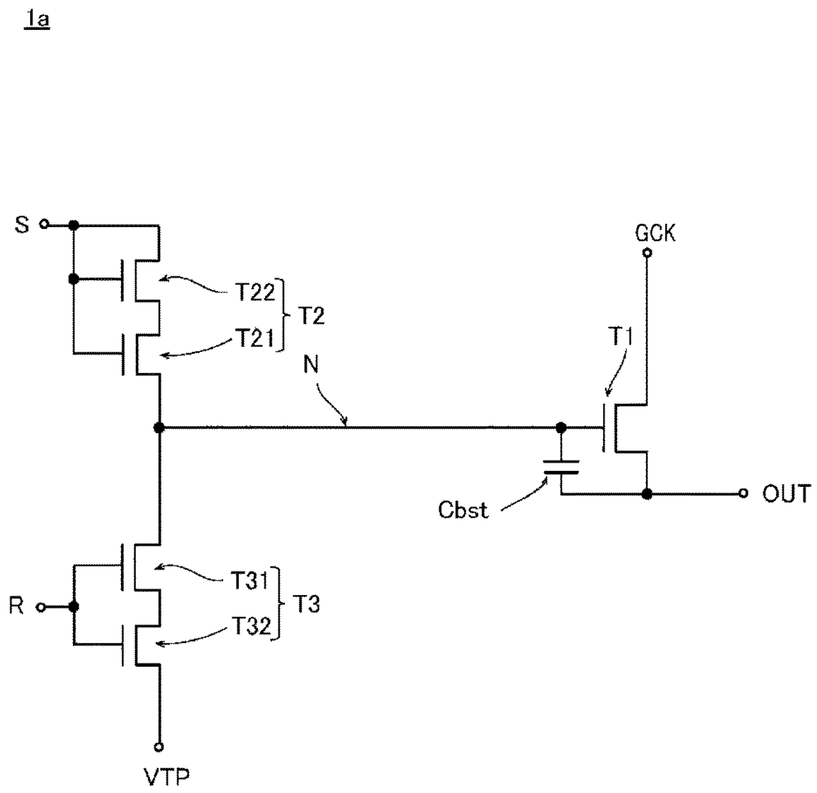
FIG. 6 is a circuit diagram illustrating a configuration of a unit circuit 1*a*.

FIG. 5 is a diagram illustrating a configuration of the gate drive circuit 1. FIG. 6 is a circuit diagram illustrating a configuration of the unit circuit 1*a*.

As illustrated in FIG. 5, the gate drive circuit 1 includes a shift register circuit that has a plurality of stages and sequentially supplies a drive signal to the gate lines 11 (G) in response to inputs of the clock signals GCK1 and GCK2. The gate drive circuit 1 includes a plurality of unit circuits 1*a*, each of which constitutes one of the plurality of stages and outputs a drive signal to the gate line 11 connected to the unit circuit 1*a*. The number of unit circuits 1*a* is the same as the number of gate lines 11. FIG. 5 illustrates some (four) of the plurality of unit circuits 1*a*.

The unit circuit 1*a* receives the clock signals GCK1 and GCK2 and the VTP signal from the level shifter circuit 6. A drive signal output from a terminal OUT of the unit circuit 1*a* in a previous stage (in the example in FIG. 5, one stage before) is input to a terminal S of the unit circuit 1*a* as a set signal. A drive signal output from a terminal OUT of the unit circuit 1*a* in a subsequent stage (in the example of FIG. 5, one stage after) is input to a terminal R of the unit circuit 1*a* as a reset signal. Thus, when a gate start pulse signal as a set signal is input from the level shifter circuit 6 to the first-stage unit circuit 1*a*, a drive signal is sequentially output to the gate lines 11 until the final-stage unit circuit 1*a*.

As illustrated in FIG. 6, the unit circuit 1*a* includes transistors T1 to T3, a capacitor Cbst, and a node N. The node N connects the transistors T1 to T3 and the capacitor Cbst.

The transistor T1 is a transistor for outputting a drive signal to the gate line 11 connected to the unit circuit 1*a*. The transistor T1 outputs a drive signal to the gate line 11 in response to the clock signal GCK1 (or the clock signal GCK2) input to a terminal GCK. The bootstrap capacitor Cbst is a capacitor for turning on the transistor T1 by a potential increased by being charged.

A gate electrode of the transistor T1 is connected to the node N. A source electrode of the transistor T1 is connected to the terminal GCK. A drain electrode of the transistor T1 is connected to the terminal OUT from which a drive signal is output. One end of the bootstrap capacitor Cbst is connected to the gate electrode of the transistor T1, and another end of the bootstrap capacitor Cbst is connected to the drain electrode of the transistor T1.

The transistor T2 is a transistor for increasing (charging) a potential of the node N in response to an input of a set signal. A gate electrode and a source electrode of the transistor T2 are connected to the terminal S to which a set signal is input. A drain electrode of the transistor T2 is connected to the node N.

The transistor T3 is a transistor for decreasing (discharging) a potential of the node N in response to an input of a reset signal. A gate electrode of the transistor T3 is connected to the terminal R to which a reset signal is input. A source electrode of the transistor T3 is connected to a terminal VTP to which a VTP signal is input. A drain electrode of the transistor T3 is connected to the node N.

Semiconductor layers of the transistors T1 to T3 include an oxide semiconductor. As the oxide semiconductor, an In—Ga—Zn—O based oxide semiconductor having crystallinity can be used. This makes it possible to reduce power consumption, increase drive speed, and achieve high definition, compared to when amorphous silicon is used for the transistors.

Figure 7:
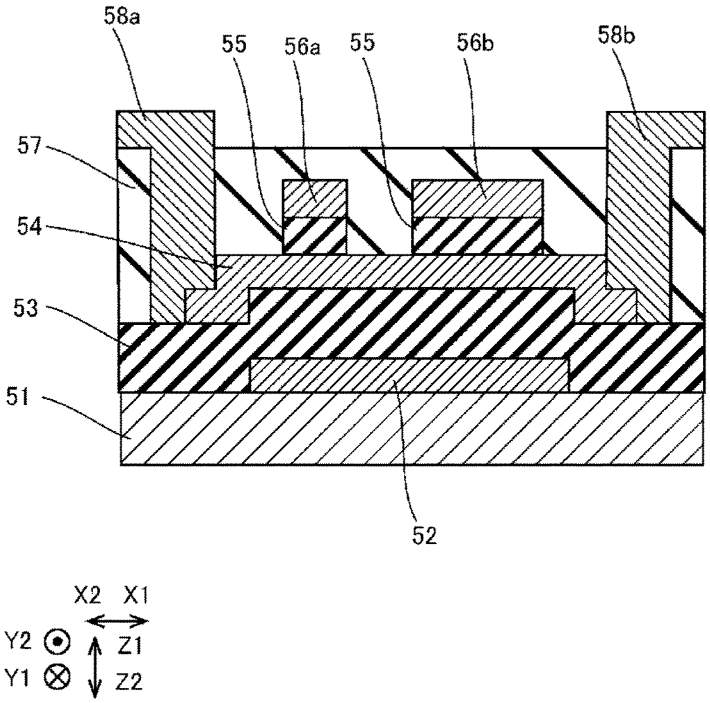
FIG. 7 is a cross-sectional view illustrating a structure of transistors T2 and T3 according to the first embodiment.

FIG. 7 is a cross-sectional view illustrating a structure of the transistors T2 and T3 according to the first embodiment. Note that the transistor T3 has the same configuration as the transistor T2, so the configuration of the transistor T2 will be described and a description of the configuration of the transistor T3 will be omitted. The transistor T2 includes a substrate 51, a conductor layer 52, a first insulating layer 53, a semiconductor layer 54, a second insulating layer 55, a first gate electrode 56*a*, a second gate electrode 56*b*, a third insulating layer 57, a drain electrode 58*a*, and a source electrode 58*b*. The conductor layer 52, the first insulating layer 53, the semiconductor layer 54, the second insulating layer 55, the first gate electrode 56*a* and the second gate electrode 56*b*, the third insulating layer 57, and the drain electrode 58*a* and the source electrode 58*b* are layered on the substrate 51 in this order. The transistor T2 is a top gate transistor.

Here, as illustrated in FIG. 7, a normal direction of the transistor T2 is defined as a Z1 direction, and a direction opposite to the Z1 direction is defined as a Z2 direction. A direction from the drain electrode 58*a* toward the source electrode 58*b* is defined as an X1 direction, and a direction opposite to the X1 direction is defined as an X2 direction. A direction orthogonal to the X1 direction in a plan view is defined as a Y1 direction, and a direction opposite to the Y1 direction is defined as a Y2 direction.

The substrate 51 is a substrate containing glass and/or resin. The conductor layer 52 is made from a metal (e.g., copper, silver, gold, etc.). Note that the conductor layer 52 may be composed of a transparent electrode (e.g., indium tin oxide (ITO)). The first insulating layer 53, the second insulating layer 55, and the third insulating layer 57 are made from, for example, an inorganic material or an organic material, and have insulating properties. The first gate electrode 56*a*, the second gate electrode 56*b*, the drain electrode 58*a*, and the source electrode 58*b* are made from a metal (e.g. copper, silver, gold, etc.). Note that the first gate electrode 56*a*, the second gate electrode 56*b*, the drain electrode 58*a*, and the source electrode 58*b* may be composed of a transparent electrode (e.g., ITO).

Figure 8:
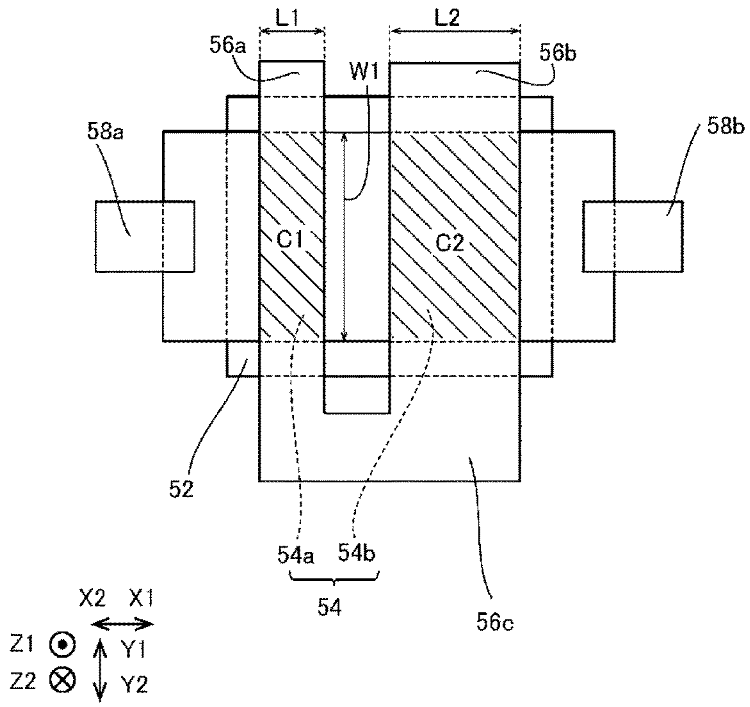
FIG. 8 is a plan view schematically illustrating the structure of the transistors T2 and T3 according to the first embodiment.

FIG. 8 is a plan view schematically illustrating the structure of the transistors T2 and T3 according to the first embodiment. As illustrated in FIG. 8, in the transistor T2, the first gate electrode 56*a* is positioned closer to the drain electrode 58*a* than the second gate electrode 56*b*. In the transistor T2, the second gate electrode 56*b* is positioned closer to the source electrode 58*b* than the first gate electrode 56*a*.

As illustrated in FIG. 8, the semiconductor layer 54 includes a first semiconductor portion 54*a* and a second semiconductor portion 54*b*. The first semiconductor portion 54*a* is connected to the drain electrode 58*a* that is connected to the node N (a portion where a potential becomes high). The second semiconductor portion 54*b* is connected to the source electrode 58*b* that has a potential equal to or lower than the potential of the node N. A portion of the first gate electrode 56*a* overlaps the first semiconductor portion 54*a* in a plan view. A portion of the second gate electrode 56*b* overlaps the second semiconductor portion 54*b* in a plan view. The first semiconductor portion 54*a* includes a first channel C1 that overlaps with the first gate electrode 56*a*. The second semiconductor portion 54*b* includes a second channel C2 that overlaps with the second gate electrode 56*b*. The transistor T2 includes a connecting portion 56*c* that connects the first gate electrode 56*a* and the second gate electrode 56*b* at a position that does not overlap with the semiconductor layer 54 in a plan view. With these, the transistor T2 can be regarded as a transistor in which a transistor T21 including the first channel C1 and a transistor T22 including the second channel C2 are connected in series, as illustrated in FIG. 6. That is, the transistors T2 each have a tandem structure. The transistor T3 can be regarded as a transistor in which a transistor T31 including a first channel C1 and a transistor T32 including a second channel C2 are connected in series. That is, the transistors T3 each have a tandem structure.

Here, in the first embodiment, as illustrated in FIG. 8, a length L2 of the second channel C2 in the X1 direction is longer than a length L1 of the first channel C1 in the X1 direction. In the first embodiment, the transistor T2 is configured such that a length L2 of the second gate electrode 56*b* is longer than a length L1 of the first gate electrode 56*a*, and thus the length L2 of the second channel C2 is longer than the length L1 of the first channel C1. A width W1 of the second channel C2 in the Y1 direction is equal to a width W1 of the first channel C1 in the Y1 direction. This allows a source-drain voltage Vds of the second channel C2 to be increased, thus reducing a source-drain voltage of the first channel C1. As a result, a withstand voltage required for the transistors T2 and T3 can be reduced, and a rate of deterioration of the transistors T2 and T3 can be slowed down.

Operation of Unit Circuit 1*a* According to First Embodiment

Figure 9:
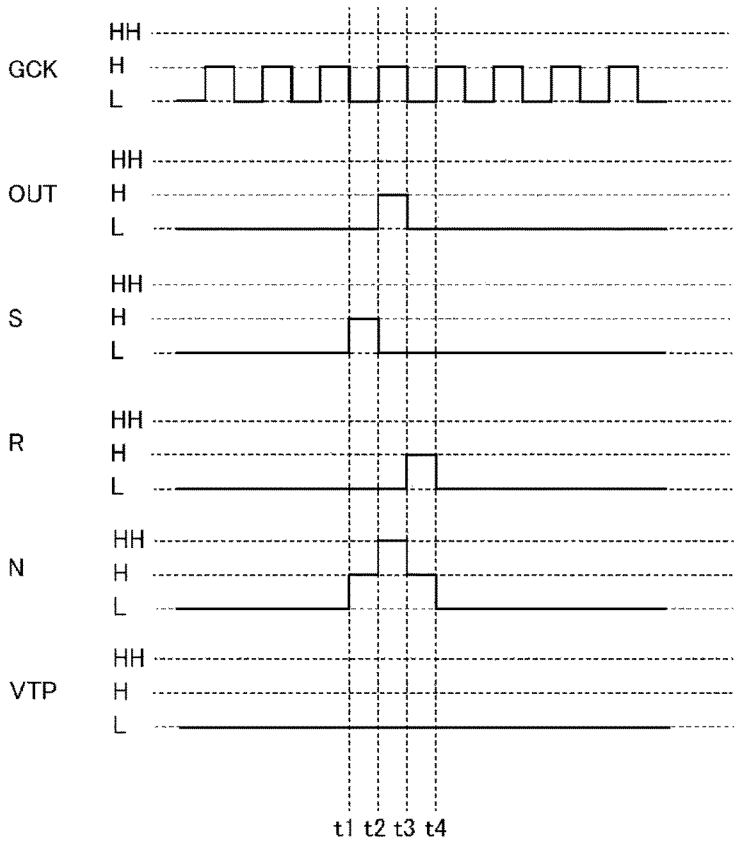
FIG. 9 is a timing chart for describing relationships between terminals of the unit circuit 1*a* and potentials during a display period according to the first embodiment.
Figure 10:
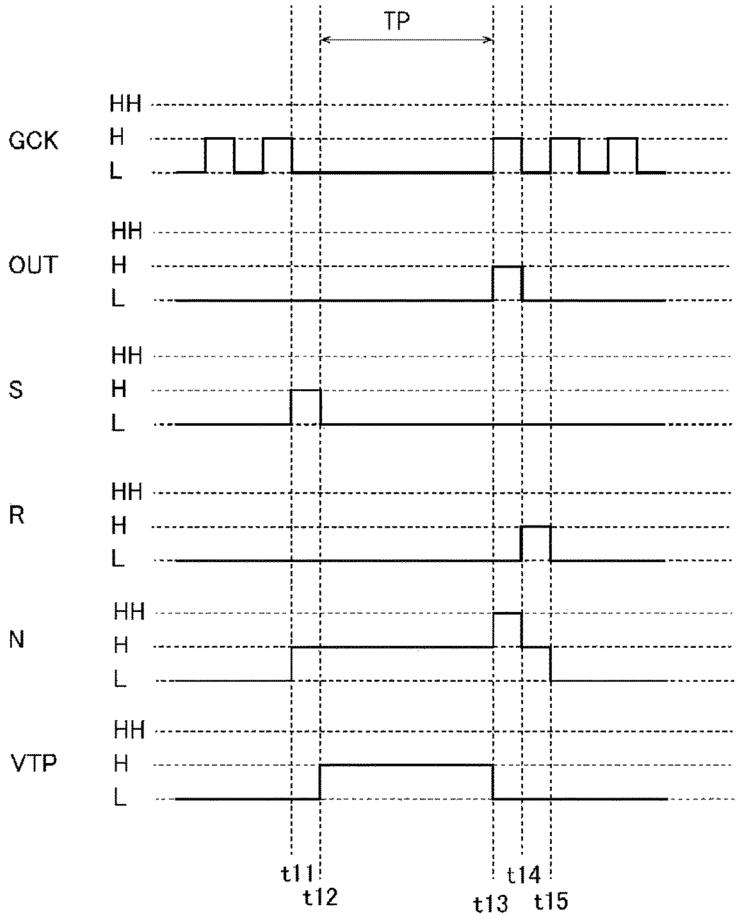
FIG. 10 is a timing chart for describing relationships between the terminals of the unit circuit 1*a* and potentials during a period including a time when the display period is switched to a touch detection period TP and a time when the touch detection period TP is switched to the display period according to the first embodiment.

FIG. 9 is a timing chart for describing relationships between the terminals of the unit circuit 1*a* and potentials during a display period according to the first embodiment. FIG. 10 is a timing chart for describing relationships between the terminals of the unit circuit 1*a* and potentials during a period including a time when the display period is switched to a touch detection period TP and a time when the touch detection period TP is switched to the display period according to the first embodiment.

As illustrated in FIG. 9, the clock signal GCK1 or GCK2 is input to the terminal GCK of the unit circuit 1*a*. For example, as illustrated in FIG. 5, the clock signal GCK1 is input to the terminals GCK of the unit circuits 1*a* in odd-numbered stages, and the clock signal GCK2 is input to the terminals GCK of the unit circuits 1*a* in even-numbered stages. Here, in FIGS. 9 and 10, a low level voltage state is denoted by “L”, and a high level voltage state is denoted by “H”. In addition, a voltage state higher than the high level is denoted by “HH”.

At time t1, when a set signal is input to the terminal S (when a voltage becomes “H”), the node N is charged from “L” to “H”. Then, at time t2, when the potential of the terminal GCK becomes “H”, the potential of the node N rises from “H” to “HH”. As a result, the potential of the terminal OUT becomes “H”, which causes a gate signal to be output, a set signal to be input to the unit circuit 1*a* in the next stage, and a reset signal to be input to the unit circuit 1*a* in the previous stage. At time t3, when a reset signal is input to the terminal R (when a voltage becomes "H") the node N is discharged from "HH" to "H", and at time t4, the node N is discharged from "H" to "L".

As illustrated in FIG. 10, during the touch detection period TP, the input of the clock signals GCK1 and GCK2 is stopped while the VTP signal is input to the terminal VTP. At time t11, a set signal is input to the terminal S of the unit circuit 1*a*, and then at time t12, the VTP signal is input to the terminal VTP (the VTP signal becomes "H"), and the potential of the node N is maintained at "H" until time t13 when the VTP signal becomes "L". Then at time t13, when the clock signal GCK1 or GCK2 is input to the terminal GCK and the potential of the terminal GCK becomes "H", the potential of the node N becomes "HH", the potential of the terminal OUT becomes "H", and a gate signal is output. Then, at time t14, when a reset signal is input to the terminal R (when the voltage becomes "H"), the node N is discharged from "HH" to "H", and at time t15, the node N is discharged from "H" to "L".

Second Embodiment

Next, a configuration of a gate drive circuit 201 according to a second embodiment will be described with reference to FIGS. 11 to 13. In transistors T202 and T203 in the second embodiment, a width W2 of a second channel C12 is narrower than a width W1 of a first channel C1. Note that the same configurations as those of the first embodiment will be denoted by the same reference signs as those of the first embodiment, and descriptions thereof will be omitted.

Figure 11:
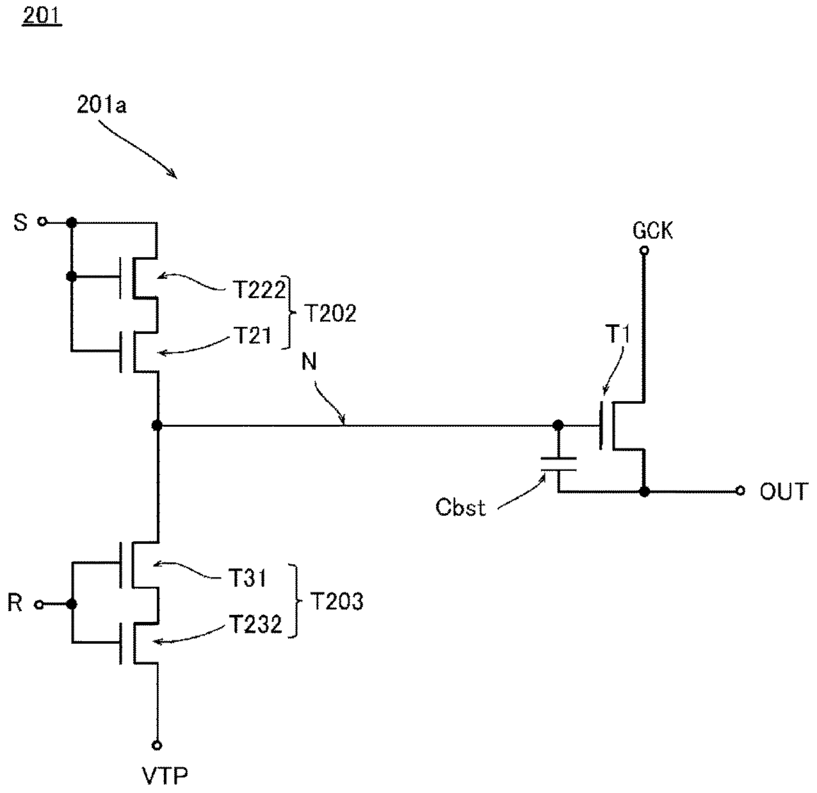
FIG. 11 is a circuit diagram illustrating a configuration of a gate drive circuit 201 according to a second embodiment.

FIG. 11 is a circuit diagram illustrating a configuration of the gate drive circuit 201 according to the second embodiment. As illustrated in FIG. 11, the gate drive circuit 201 according to the second embodiment includes a unit circuit 201*a*. The unit circuit 201*a* includes the transistors T202 and T203. The transistor T202 is configured by connecting in series a transistor T21 including the first channel C1 and a transistor T222 including the second channel C12 (see FIG. 13). The transistor T203 is configured by connecting in series a transistor T31 including the first channel C1 and a transistor T232 including the second channel C12 (see FIG. 13).

Figure 12:
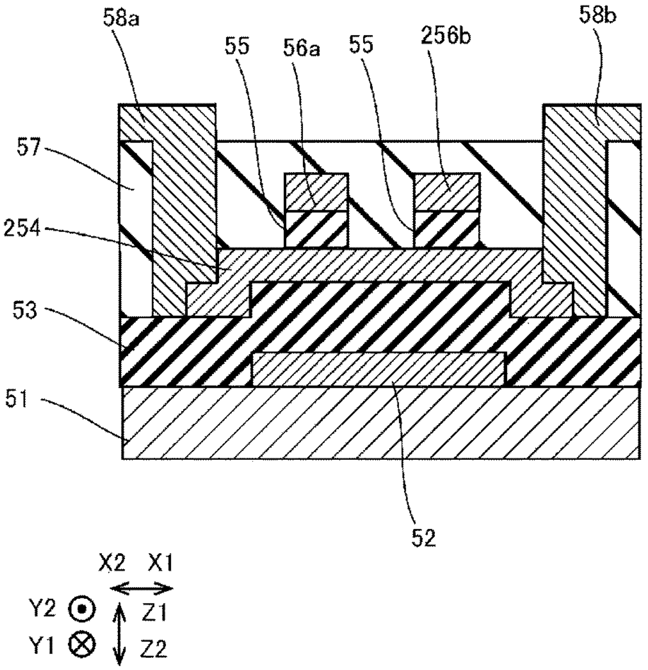
FIG. 12 is a cross-sectional view illustrating a structure of transistors T202 and T203 according to the second embodiment.

FIG. 12 is a cross-sectional view illustrating a structure of the transistors T202 and T203 according to the second embodiment. FIG. 13 is a plan view schematically illustrating the structure of the transistors T202 and T203 according to the second embodiment. The transistor T203 has a configuration similar to that of the transistor T202, and thus a description thereof will be omitted. As illustrated in FIG. 12, the transistor T202 includes a first gate electrode 56*a*, a second gate electrode 256*b*, and a semiconductor layer 254.

Figure 13:
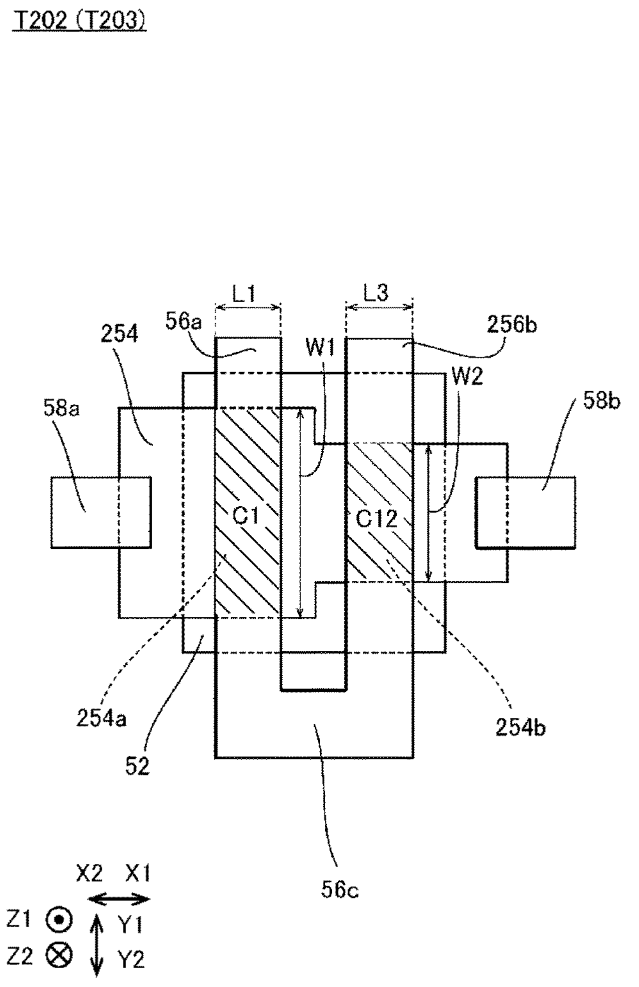
FIG. 13 is a plan view schematically illustrating the structure of the transistors T202 and T203 according to the second embodiment.

As illustrated in FIG. 13, the semiconductor layer 254 includes a first semiconductor portion 254*a* connected to a drain electrode 58*a* and a second semiconductor portion 254*b* connected to a source electrode 58*b*. A portion of the second gate electrode 256*b* overlaps the second semiconductor portion 254*b* in a plan view. The second semiconductor portion 254*b* includes the second channel C12 that overlaps with the second gate electrode 256*b*.

Here, in the second embodiment, the width W2 of the second channel C12 is narrower than the width W1 of the first channel C1. A length L3 of the second channel C12 is equal to a length L1 of the first channel C1. In the second embodiment, the transistor T202 is configured such that a width W2 of the second semiconductor portion 254*b* is narrower than a width W1 of the first semiconductor portion 254*a*, and thus the width W2 of the second channel C12 is narrower than the width W1 of the first channel C1. This allows a source-drain voltage Vds of the second channel C12 to be increased, thus reducing a source-drain voltage of the first channel C1. As a result, a withstand voltage required for the transistors T202 and T203 can be reduced, and a rate of deterioration of the transistors T202 and T203 can be slowed down.

Results Compared with Comparative Examples

Next, with reference to FIGS. 14 and 15, results of comparison between an example in the first embodiment (hereinafter referred to as "first example"), an example in the second embodiment (hereinafter referred to as "second example"), and two comparative examples (first comparative example and second comparative example).

Figure 14:
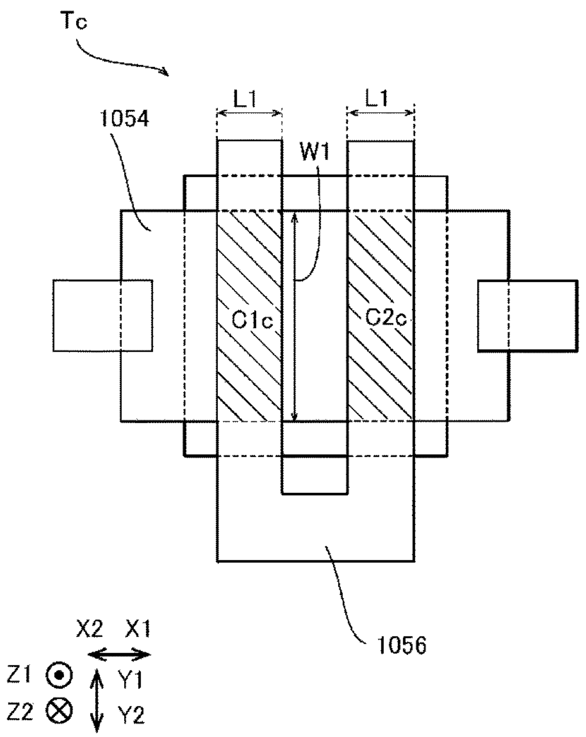
FIG. 14 is a diagram for describing a configuration of a transistor Tc according to a first comparative example.

FIG. 14 is a diagram for describing a configuration of a transistor Tc according to the first comparative example. The transistor Tc includes a first channel C1*c* and a second channel C2*c* in regions where a semiconductor layer 1054 and a gate electrode 1056 overlap. A width W1 and a length L1 of the first channel C1*c* are equal to a width W1 and a length L1 of the second channel C2*c*, respectively.

In a transistor according to the second comparative example, although not illustrated, a length of a first channel is longer than a length of a second channel, and a width of the first channel is equal to a width of the second channel.

The first example is the transistor T2 according to the first embodiment, and the second example is the transistor T202 according to the second embodiment.

Figure 15:
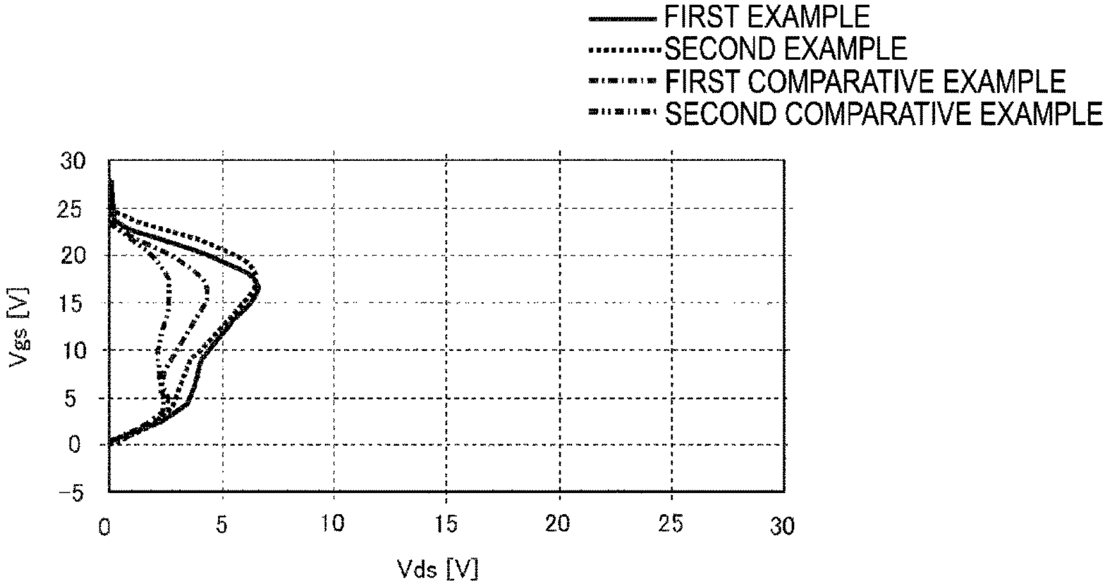
FIG. 15 is a diagram showing measurement results for describing results of comparing a first example, a second example, the first comparative example, and a second comparative example.

FIG. 15 shows measurement results for describing results of comparing the first example, the second example, the first comparative example, and the second comparative example. In each of the transistors in the first example, the second example, the first comparative example, and the second comparative example, a voltage of 30 V was applied to a drain electrode and 0 V was applied to a source electrode. Voltages of 0 V to 28 V were then sequentially applied to a gate electrode, and a source-drain voltage Vds in the second channel was measured.

As shown in FIG. 15, the maximum value of Vds according to the first comparative example was 4.2 V, and the maximum value of Vds according to the second comparative example was 2.8 V. That is, a source-drain voltage Vds in the first channel can be said to be a difference between 30 V and the source-drain voltage Vds in the second channel, so the source-drain voltage Vds in the first channel according to the first comparative example was 25.8 V, and the source-drain voltage Vds in the first channel according to the second comparative example was 27.2 V.

As shown in FIG. 15, the maximum value of Vds according to the first example and the maximum value of Vds according to the second example were both 6.5 V. That is, the source-drain voltage Vds in the first channel according to the first example and the source-drain voltage Vds in the first channel according to the second example were 23.5 V. As a result, it was found that the source-drain voltage Vds in the first channel can be reduced more in the first example and the second example than in the first comparative example and the second comparative example. A withstand voltage required for the transistors T2 and T3 in the first example and the transistors T202 and T203 in the second example can be reduced, and a rate of deterioration of these transistors can be slowed down.

Third Embodiment

Next, a configuration of a gate drive circuit 301 according to a third embodiment will be described with reference to FIGS. 16 to 19. In a transistor T302 in the third embodiment, mobility of electrons or holes in a second semiconductor layer 354*b* is lower than mobility of electrons or holes in a first semiconductor layer 354*a*. Note that the same configurations as those of the first embodiment will be denoted by the same reference signs as those of the first embodiment, and descriptions thereof will be omitted.

Figure 16:
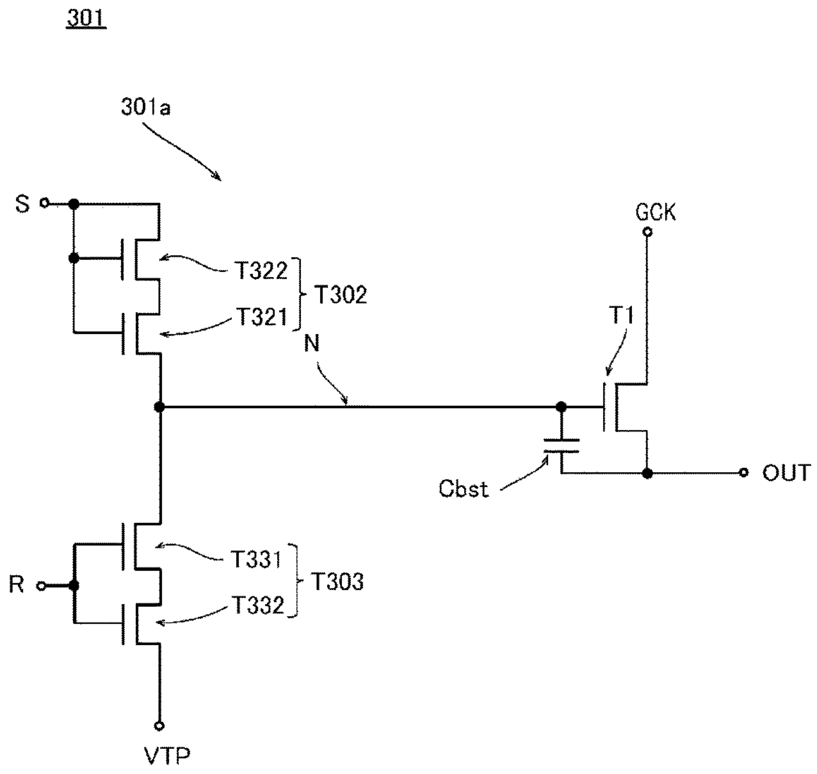
FIG. 16 is a circuit diagram illustrating a configuration of a gate drive circuit 301 according to a third embodiment.

FIG. 16 is a circuit diagram illustrating a configuration of the gate drive circuit 301 according to the third embodiment. As illustrated in FIG. 16, the gate drive circuit 301 according to the third embodiment includes a unit circuit 301*a*. The unit circuit 301*a* includes transistors T302 and T303. The transistor T302 is configured by connecting in series a transistor T321 including a first channel C21 (see FIG. 17) and a transistor T322 including a second channel C22 (see FIG. 17). The transistor T303 is configured by connecting in series a transistor T331 including a first channel C21 and a transistor T332 including a second channel C22.

Figure 17:
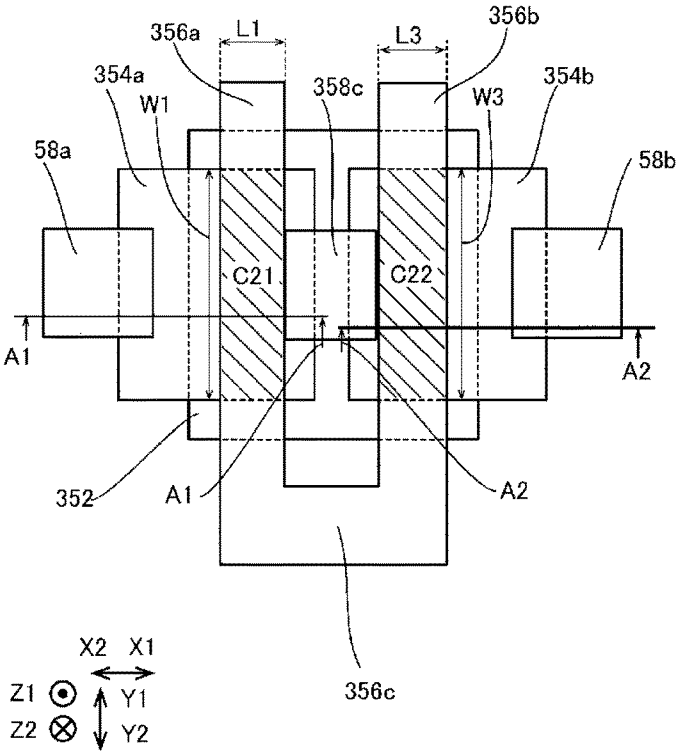
FIG. 17 is a plan view schematically illustrating a structure of transistors T302 and T303 according to the third embodiment.
Figure 18:
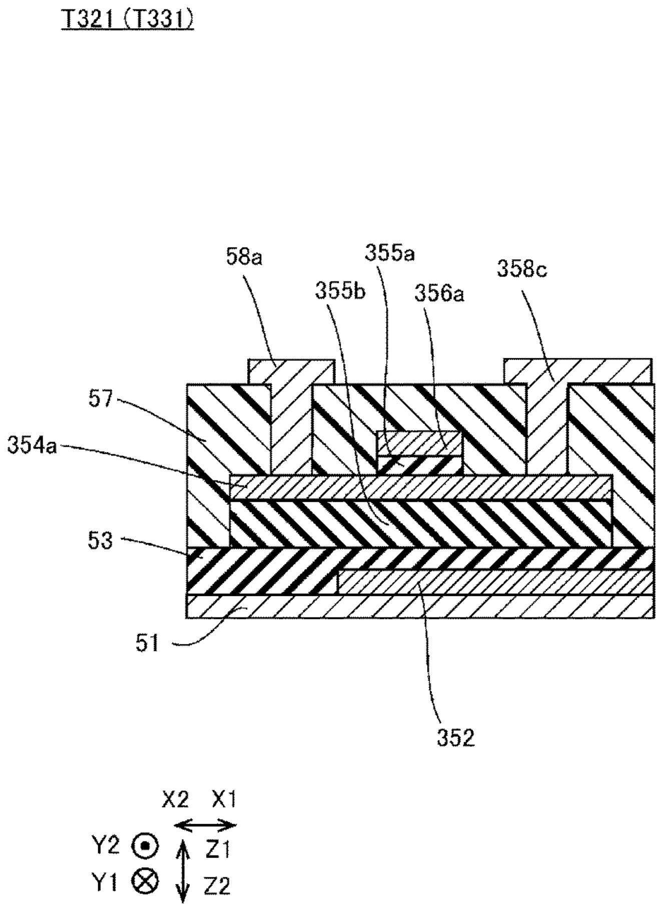
FIG. 18 is a cross-sectional view illustrating a structure of transistors T321 and T331 according to the third embodiment, taken along line A1-A1 in FIG. 17.
Figure 19:
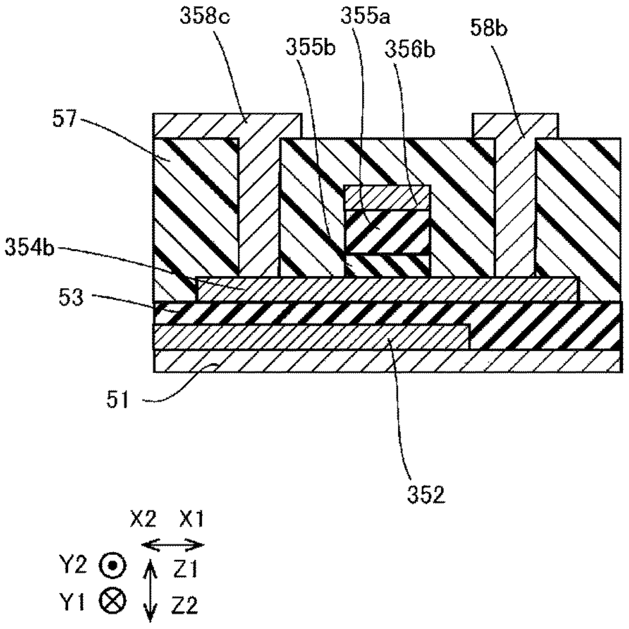
FIG. 19 is a cross-sectional view illustrating a structure of transistors T322 and T332 according to the third embodiment, taken along line A2-A2 in FIG. 17.

FIG. 17 is a plan view schematically illustrating a structure of the transistors T302 and T303 according to the third embodiment. FIG. 18 is a cross-sectional view illustrating a structure of the transistors T321 and T331 according to the third embodiment, taken along line A1-A1 in FIG. 17. FIG. 19 is a cross-sectional view illustrating a structure of the transistors T322 and T332 according to the third embodiment, taken along line A2-A2 in FIG. 17. Note that the transistor T303 has a configuration similar to that of the transistor T302, and thus a description thereof will be omitted.

As illustrated in FIG. 17, the transistor T302 includes a conductor layer 352, a first gate electrode 356*a*, a second gate electrode 356*b*, a first semiconductor layer 354*a*, a second semiconductor layer 354*b*, and a connection electrode 358*c*. The first gate electrode 356*a* overlaps the first semiconductor layer 354*a*. The second gate electrode 356*b* overlaps the second semiconductor layer 354*b*. The first gate electrode 356*a* is connected to the second gate electrode 356*b* by the connecting portion 356*c*.

A length L1 of the first channel C21, which is a region of the first semiconductor layer 354*a* overlapping with the first gate electrode 356*a*, is equal to a length L3 of the second channel C22, which is a region of the second semiconductor layer 354*b* overlapping with the second gate electrode 356*b*. A width W1 of the first channel C21 is equal to a width W3 of the second channel C22.

Here, in the third embodiment, the mobility of electrons or holes in the second semiconductor layer 354*b* is lower than the mobility of electrons or holes in the first semiconductor layer 354*a*. For example, both the first semiconductor layer 354*a* and the second semiconductor layer 354*b* are made of In—Ga—Zn—O based oxide semiconductors. However, an impurity concentration and/or crystallinity of the material of the second semiconductor layer 354*b* is different from an impurity concentration and/or crystallinity of the material of the first semiconductor layer 354*a*, so that the second semiconductor layer 354*b* is configured to have a mobility lower than the mobility of the first semiconductor layer 354*a*. When changing the impurity concentration, for example, an impurity doping step for changing the mobility may be added to at least one of a step of forming the first semiconductor layer 354*a* and a step of forming the second semiconductor layer 354*b*. Note that the mobility of the second semiconductor layer 354*b* may be reduced by forming the first semiconductor layer 354*a* from an In—Ga—Zn—O based oxide semiconductor and forming the second semiconductor layer 354*b* from Si. When the mobility of the second semiconductor layer 354*b* is lower than the mobility of the first semiconductor layer 354*a*, a source-drain voltage Vds of the second channel C22 can be increased, and thus a source-drain voltage of the first channel C21 can be reduced. As a result, a withstand voltage required for the transistors T302 and T303 can be reduced, and a rate of deterioration of the transistors T302 and T303 can be slowed down.

The connection electrode 358*c* is located across the first semiconductor layer 354*a* and the second semiconductor layer 354*b*, and is a conductor connecting the first semiconductor layer 354*a* and the second semiconductor layer 354*b*. A material of the connection electrode 358*c* is, for example, the same material as that of a drain electrode 58*a*. A layer in which the connection electrode 358*c* is formed is, for example, the same layer in which the drain electrode 58*a* is formed.

As illustrated in FIGS. 18 and 19, the first semiconductor layer 354*a* and the second semiconductor layer 354*b* are formed in different layers. For example, the first semiconductor layer 354*a* is formed in a layer above the layer in which the second semiconductor layer 354*b* is formed. This makes it possible to easily change the material of the first semiconductor layer 354*a* and the material of the second semiconductor layer 354*b*.

Method of Manufacturing Transistor T302 According to Third Embodiment

Next, a method of manufacturing the transistor T302 according to the third embodiment will be described with reference to FIGS. 17 to 31. FIGS. 20, 22, 24, 26, 28, and 30 are cross-sectional views illustrating a configuration of the transistor T321 of the transistor T302. FIGS. 21, 23, 25, 27, 29, and 31 are cross-sectional views illustrating a configuration of the transistor T322 of the transistor T302.

Figure 20:
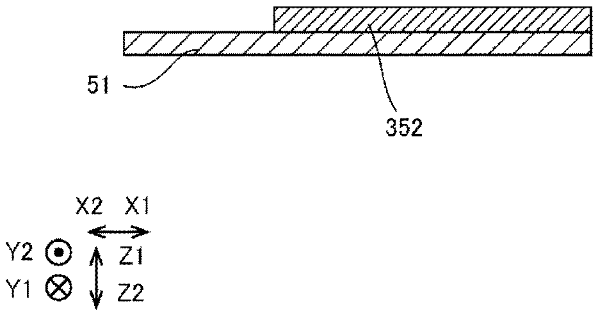
FIGS. 20, 22, 24, 26, 28, and 30 are cross-sectional views illustrating a configuration of the transistor T321 of the transistor T302 according to the third embodiment.
Figure 21:
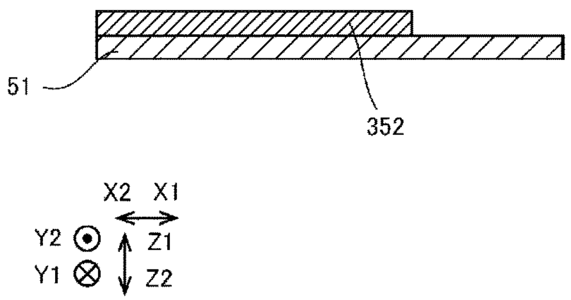
FIG. 21 is a cross-sectional view illustrating a configuration of the transistor T322 of the transistor T302 according to the third embodiment.
Figure 22:
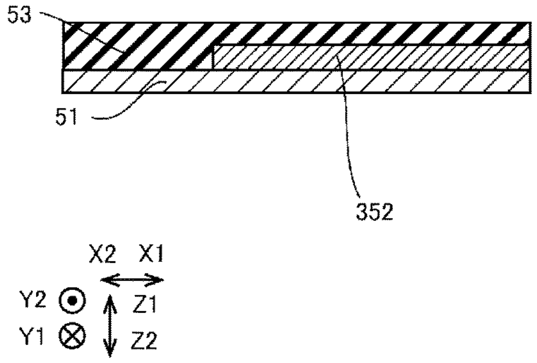
Figure 23:
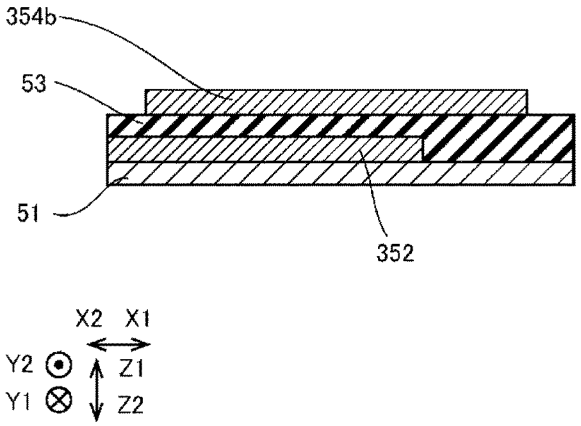
FIG. 23 is a cross-sectional view illustrating a configuration of the transistor T322 of the transistor T302 according to the third embodiment.

First, as illustrated in FIGS. 20 and 21, the conductor layer 352 is formed on a substrate 51. Then, as illustrated in FIGS. 22 and 23, a first insulating layer 53 is formed so as to cover the conductor layer 352. Then, as illustrated in FIG. 23, the second semiconductor layer 354*b* is formed on the first insulating layer 53 in a region of the transistor T302 that will be the transistor T322.

Figure 24:
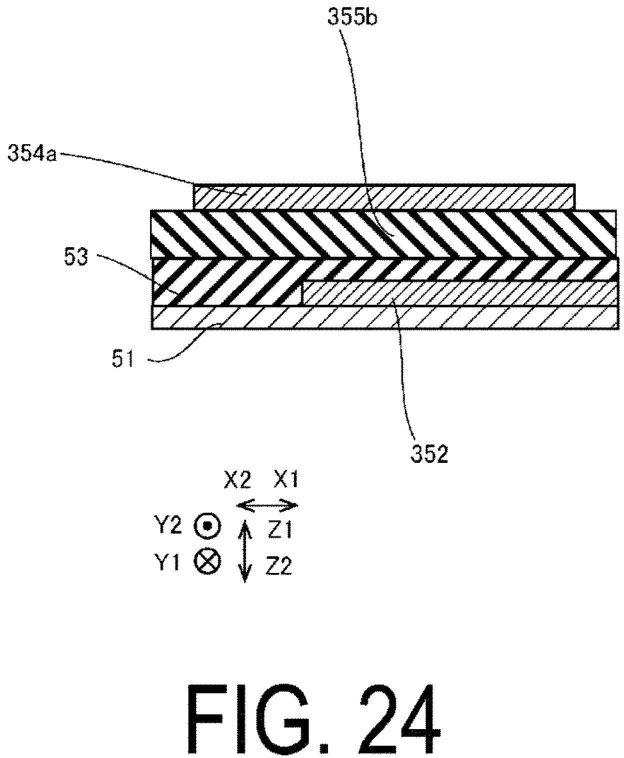
Figure 25:
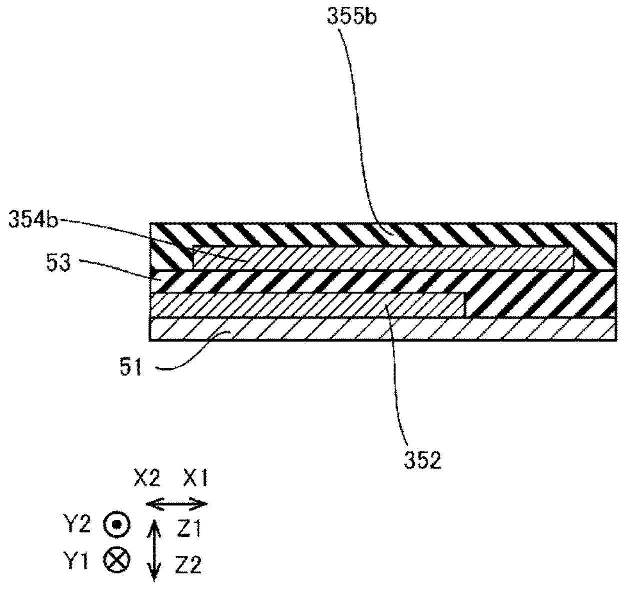
FIG. 25 is a cross-sectional view illustrating a configuration of the transistor T322 of the transistor T302 according to the third embodiment.

Then, as illustrated in FIGS. 24 and 25, an insulating layer 355*b* is formed so as to cover the second semiconductor layer 354*b*. Then, as illustrated in FIG. 24, the first semiconductor layer 354*a* is formed on the insulating layer 355*b* in a region of the transistor T302 that will be the transistor T321.

Figure 26:
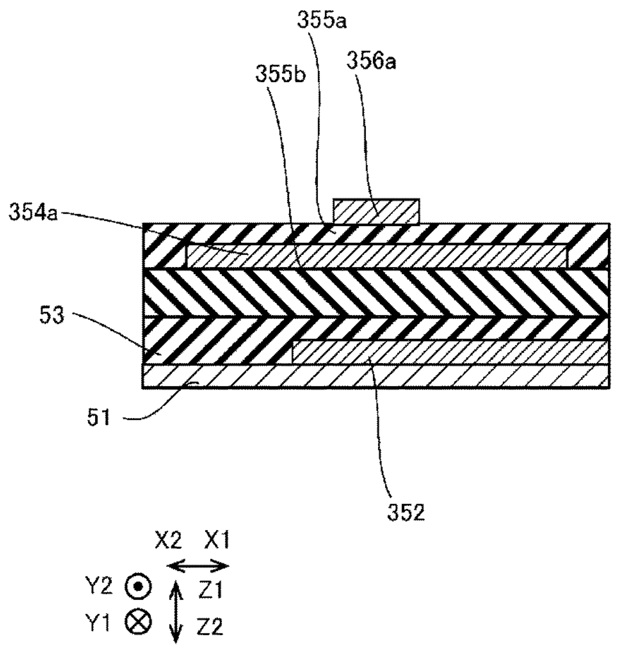
Figure 27:
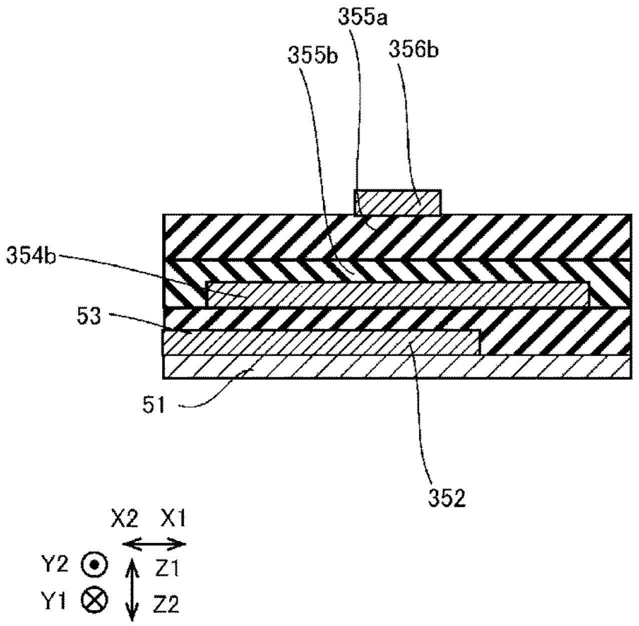
FIG. 27 is a cross-sectional view illustrating a configuration of the transistor T322 of the transistor T302 according to the third embodiment.

Then, as illustrated in FIGS. 26 and 27, an insulating layer 355*a* is formed so as to cover the first semiconductor layer 354*a*. Then, as illustrated in FIG. 26, the first gate electrode 356*a* is formed on the insulating layer 355*a* in a region of the transistor T302 that will be the transistors T321. The second gate electrode 356*b* is formed on the insulating layer 355*a* in a region of the transistor T302 that will be the transistor T322.

Figure 28:
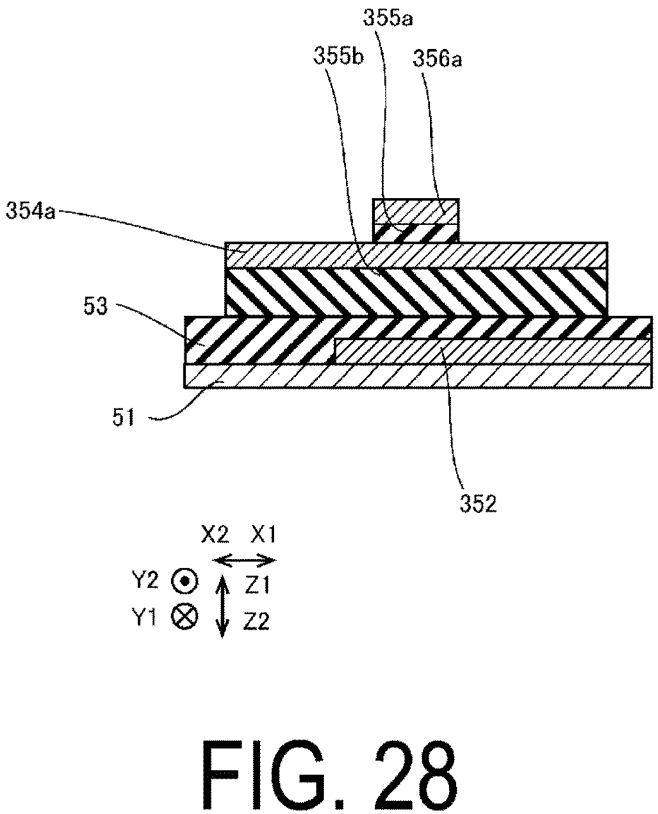
Figure 29:
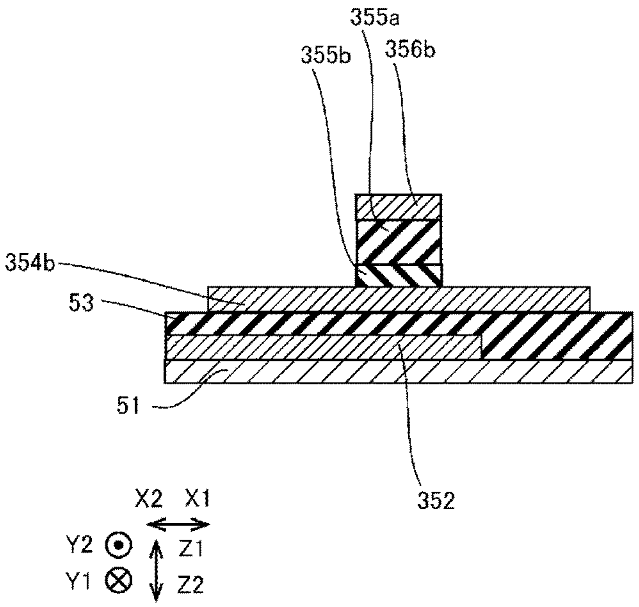
FIG. 29 is a cross-sectional view illustrating a configuration of the transistor T322 of the transistor T302 according to the third embodiment.

Then, as illustrated in FIG. 28, part of the insulating layer 355*a* is removed so as to expose the first semiconductor layer 354*a*. As illustrated in FIG. 29, part of the insulating layer 355*a* is removed so as to expose the second semiconductor layer 354*b*.

Figure 30:
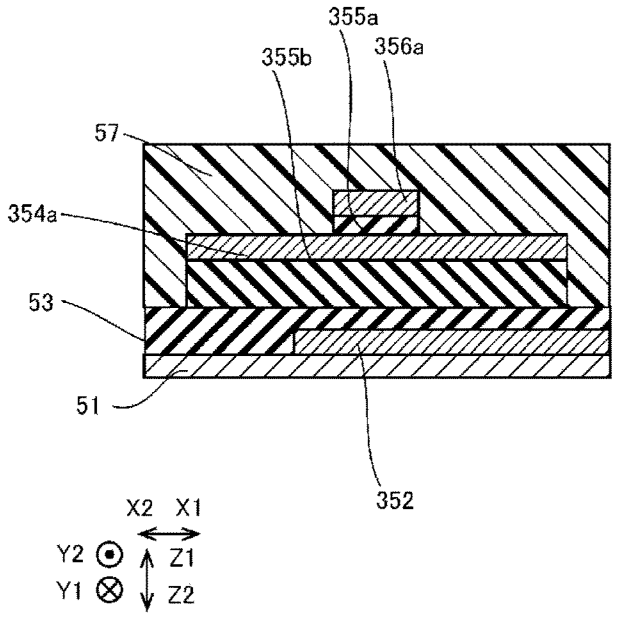
Figure 31:
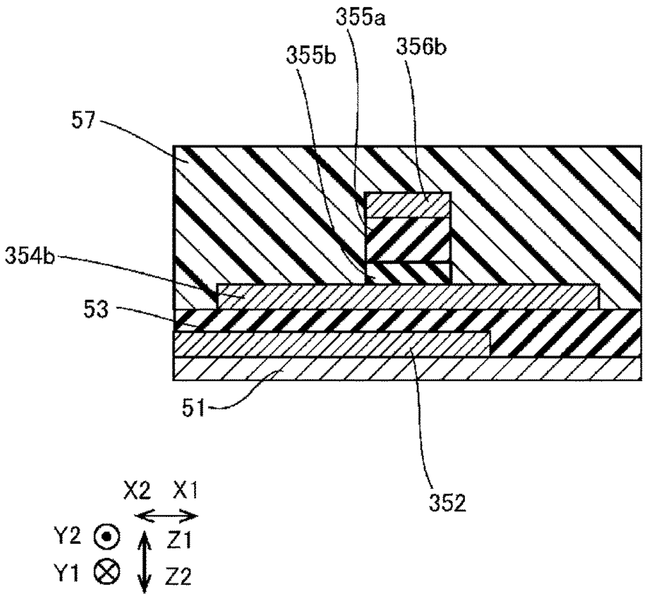
FIG. 31 is a cross-sectional view illustrating a configuration of the transistor T322 of the transistor T302 according to the third embodiment.

Then, as illustrated in FIGS. 30 and 31, a third insulating layer 57 is formed so as to cover the first gate electrode 356*a*, the second gate electrode 356*b*, the first semiconductor layer 354*a*, and the second semiconductor layer 354*b*.

Then, as illustrated in FIGS. 18 and 19, contact holes are formed at a position in an X2 direction as viewed from the first gate electrode 356*a*, at positions between the first gate electrode 356*a* and the second gate electrode 356*b*, and at a position in an X1 direction as viewed from the second gate electrode 356*b*. Then, the drain electrode 58*a* is formed in the contact hole formed at the position in the X2 direction as viewed from the first gate electrode 356*a*. The connection electrode 358*c* is formed in the contact holes formed between the first gate electrode 356*a* and the second gate electrode 356*b*. A source electrode 58*b* is formed in the contact hole formed at the position in the X1 direction as viewed from the second gate electrode 356*b*. In this manner, the transistor T302 is manufactured.

MODIFIED EXAMPLES

Although embodiments of the disclosure have been described above, the embodiments described above are merely examples for implementing the disclosure. Thus, the disclosure is not limited to the embodiments described above, and can be implemented by appropriately modifying the embodiments described above without departing from the scope. Now, modified examples of the above-described embodiments will be described.

(1) In the first to third embodiments, the display device is configured as a liquid crystal display device. However, the disclosure is not limited to this example. For example, the display device may be configured as an organic EL display device, a micro LED display device, or the like.

(2) In the first to third embodiments, examples are illustrated, for both the transistor to which the set signal is input and the transistor to which the reset signal is input in the unit circuit, in which the length of the second channel is made longer than the length of the first channel, the width of the second channel is made narrower than the width of the first channel, or the mobility of the second semiconductor layer is made smaller than the mobility of the first semiconductor layer. However, the disclosure is not limited these examples. That is, for only one of the transistor to which the set signal is input and the transistor to which the reset signal is input, the length of the second channel may be made longer than the length of the first channel, the width of the second channel may be made narrower than the width of the first channel, or the mobility of the second semiconductor layer may be made smaller than the mobility of the first semiconductor layer.

Figure 32:
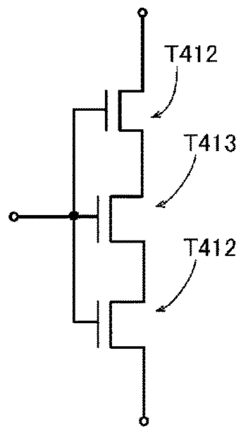
FIG. 32 is a diagram illustrating a configuration of a transistor T402 according to a modified example of the first to third embodiments.

(3) In the first to third embodiments, an example is illustrated in which the transistor has a tandem structure in which two transistors are connected in series in a transistor. However, the disclosure is not limited to this example. The transistor may be configured to have a structure in which three transistors (T412 to T414) are connected in series, as in a transistor T402 according to a modified example illustrated in FIG. 32, or may be configured to have a structure in which four or more transistors are connected in series. In this case, a length of a channel (second channel) of at least the transistor on the lowest potential side (source electrode side) among the three (or four or more) transistors is longer than a length of a channel (first channel) of the transistor on the highest potential side (drain electrode side), a width of the second channel is narrower than a width of the first channel, or mobility of the transistor on the lowest potential side is smaller than mobility of the transistor on the highest potential side.

(4) In the first to third embodiments, an example is illustrated in which the clock signal has two phases, the GCK1 and the GCK2. However, the disclosure is not limited to this example. The clock signal may be provided with two phases (a single phase or three or more phases).

(5) In the first to third embodiments, an example is illustrated in which the transistor includes a crystalline In—Ga—Zn—O based oxide semiconductor. However, the disclosure is not limited to this example. The transistor may include an amorphous In—Ga—Zn—O based oxide semiconductor, may include an oxide semiconductor other than the amorphous In—Ga—Zn—O based oxide semiconductor, or may include silicon.

(6) In the first to third embodiments, an example is illustrated in which the bootstrap capacitor Cbst is included in the unit circuit. However, the disclosure is not limited to this example. When the bootstrap operation can be performed by capacitance of the transistor T1, the bootstrap capacitor is not necessarily included in the unit circuit.

The above-described configuration can also be described as follows.

A drive circuit according to a first configuration is a drive circuit including a plurality of stages and configured to supply a drive signal to a group of scanning signal lines in response to an input of a clock signal, the drive circuit includes a plurality of unit circuits, each of the plurality of unit circuits constituting one stage of the plurality of stages and outputting the drive signal to a scanning signal line of the group of scanning signal lines, in which each of the plurality of unit circuits includes a node, a first transistor configured to output the drive signal to the scanning signal line, the first transistor including a gate electrode connected to the node, a source electrode being applied with the clock signal, and a drain electrode connected to the scanning signal line, a second transistor configured to receive a set signal for each of the plurality of unit circuits, the second transistor including a gate electrode configured to receive the set signal and a drain electrode connected to the node, and a third transistor configured to receive a reset signal for each of the plurality of unit circuits, the third transistor including a gate electrode configured to receive the reset signal and a drain electrode connected to the node, at least one of the second transistor and the third transistor includes a first semiconductor portion connected to the drain electrode of at least one of the second transistor and the third transistor, and a second semiconductor portion connected to the source electrode of at least one of the second transistor and the third transistor, the gate electrode of at least one of the second transistor and the third transistor includes a first gate portion overlapping the first semiconductor portion, and a second gate portion overlapping the second semiconductor portion, at least one of the second transistor and the third transistor includes a first channel being a portion of the first semiconductor portion overlapping with the first gate portion, and a second channel being a portion of the second semiconductor portion overlapping with the second gate portion, in a plan view, in a case where a direction from the drain electrode to the source electrode is defined as a first direction and a direction orthogonal to the first direction is defined as a second direction, a length of the second channel in the first direction is longer than a length of the first channel in the first direction, or a length of the second channel in the second direction is shorter than a length of the first channel in the second direction, or mobility of electrons or holes in the second semiconductor portion is lower than mobility of electrons or holes in the first semiconductor portion (first configuration).

Here, when dimensions (length and width) of the first channel are equal to dimensions (length and width) of the second channel and a material (mobility) of the first semiconductor portion is equal to a material (mobility) of the second semiconductor portion, the source-drain voltage of the first channel is greater than the source-drain voltage of the second channel. In contrast, in the first configuration, when the length of the second channel in the first direction is longer than the length of the first channel in the first direction, or when the length of the second channel in the second direction is shorter than the length of the first channel in the second direction, the source-drain voltage of the second channel can be increased, thereby preventing the source-drain voltage of the first channel from becoming too large. As a result, the withstand voltage required for the second transistor or the third transistor can be reduced, and the rate of deterioration of the second transistor or the third transistor can be slowed down.

In the first configuration, when the mobility of electrons or holes in the second semiconductor portion is lower than the mobility of electrons or holes in the first semiconductor portion, the source-drain voltage of the second channel can be increased, thereby preventing the source-drain voltage of the first channel from becoming too large. As a result, the withstand voltage required for the second transistor or the third transistor can be reduced, and the rate of deterioration of the second transistor or the third transistor can be slowed down.

In the first configuration, a length of the second gate portion in the first direction is longer than a length of the first gate portion in the first direction, which may cause the length of the second channel in the first direction to be longer than the length of the first channel in the first direction (second configuration).

According to the second configuration, the length of the second channel in the first direction can be longer than the length of the first channel in the first direction.

In the first or second configuration, a length of the second semiconductor portion in the second direction is shorter than a length of the first semiconductor portion in the second direction, which may cause the length of the second channel in the second direction to be shorter than the length of the first channel in the second direction (third configuration).

According to the third configuration, the length of the second channel in the second direction can be shorter than the length of the first channel in the second direction.

In any one of the first to third configurations, at least one of the second transistor and the third transistor may include a first semiconductor layer including the first semiconductor portion formed in the first semiconductor layer, and a second semiconductor layer including the second semiconductor portion formed in the second semiconductor layer and being a layer different from the first semiconductor layer. The mobility of electrons or holes in the second semiconductor portion may be lower than the mobility of electrons or holes in the first semiconductor portion (fourth configuration).

According to the fourth configuration, a material of the second semiconductor portion can be easily made different from a material of the first semiconductor portion, compared to when the layer in which a first semiconductor portion is formed and a layer in which the second semiconductor portion is formed are the same layer.

An active matrix substrate according to a fifth configuration includes the drive circuit according to any one of the first to fourth configurations, and a substrate on which the drive circuit is located (fifth configuration).

According to the fifth configuration, it is possible to provide an active matrix substrate capable of reducing the withstand voltage required for the transistor and slowing down the rate of deterioration of the transistor.

A display device according to a sixth configuration includes the drive circuit according to any one of the first to fourth configurations, a substrate on which the drive circuit is located, and a counter substrate located facing the substrate (sixth configuration).

According to the sixth configuration, it is possible to provide a display device capable of reducing the withstand voltage required for the transistor and slowing down the rate of deterioration of the transistor.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

The invention claimed is:

1. A drive circuit including a plurality of stages and configured to supply a drive signal to a group of scanning signal lines in response to an input of a clock signal, the drive circuit comprising:

a plurality of unit circuits, each of the plurality of unit circuits forming one stage of the plurality of stages and outputting the drive signal to a scanning signal line of the group of scanning signal lines, wherein each of the plurality of unit circuits includes:

a node, a first transistor including a first gate electrode connected to the node, a first source electrode being applied with the clock signal, and a first drain electrode connected to the scanning signal line, and a second transistor configured to receive either a set signal or a reset signal for each of the plurality of unit circuits, the second transistor including a second gate electrode configured to receive either the set signal or the reset signal, a second drain electrode connected to the node, and a second source electrode, in a plan view, in a case that a direction from the second drain electrode to the second source electrode is defined as a first direction, and a direction orthogonal to the first direction is defined as a second direction, a semiconductor layer of the second transistor includes:

a first semiconductor region positioned on a second drain electrode side, and having a length in the second direction that is a first distance, and a second semiconductor region positioned on a second source electrode side, and having a length in the second direction that is a second distance, the second gate electrode includes:

a first gate portion overlapping the first semiconductor region, and a second gate portion overlapping the second semiconductor region, and spaced apart from the first gate portion, and the second distance is shorter than the first distance.

2. The drive circuit according to claim 1, wherein:

the first semiconductor region includes a first channel overlapping the first gate portion, the second semiconductor region includes a second channel overlapping the second gate portion, and a length of the second channel in the second direction is shorter than a length of the first channel in the second direction.

3. The drive circuit according to claim 2, wherein a boundary between the first semiconductor region and the second semiconductor region is positioned between the first channel and the second channel.

4. The drive circuit according to claim 2, wherein a length of the first channel in the first direction is equal to a length of the second channel in the first direction.

5. The drive circuit according to claim 2, wherein:

the second transistor further includes:

a first gate insulating film provided between the first channel and the first gate portion, and a second gate insulating film provided between the second channel and the second gate portion, and the first gate insulating film and the second gate insulating film are separated from each other.

6. An active matrix substrate comprising:

the drive circuit according to claim 1; and a substrate on which the drive circuit is located.

7. A display device comprising:

the drive circuit according to claim 1;

a substrate on which the drive circuit is located; and a counter substrate located facing the substrate.

8. A drive circuit including a plurality of stages and configured to supply a drive signal to a group of scanning signal lines in response to an input of a clock signal, the drive circuit comprising:

a plurality of unit circuits, each of the plurality of unit circuits forming one stage of the plurality of stages and outputting the drive signal to a scanning signal line of the group of scanning signal lines, wherein each of the plurality of unit circuits includes:

a node, a first transistor including a first gate electrode connected to the node, a first source electrode being applied with the clock signal, and a first drain electrode connected to the scanning signal line, and a second transistor configured to receive either a set signal or a reset signal for each of the plurality of unit circuits, the second transistor including a second gate electrode configured to receive either the set signal or the reset signal, a second drain electrode connected to the node, and a second source electrode, the second transistor includes:

a first semiconductor portion connected to the second drain electrode, a second semiconductor portion connected to the second source electrode and spaced apart from the first semiconductor portion, and a connection electrode electrically connecting the first semiconductor portion and the second semiconductor portion to each other, the second gate electrode includes:

a first gate portion overlapping the first semiconductor portion, and positioned between the second drain electrode and the connection electrode, and a second gate portion overlapping the second semiconductor portion, and positioned between the second source electrode and the connection electrode, and a mobility of electrons or holes in the second semiconductor portion is lower than a mobility of electrons or holes in the first semiconductor portion.

9. The drive circuit according to claim 8, wherein:

the first semiconductor portion includes a first channel overlapping the first gate portion, the second semiconductor portion includes a second channel overlapping the second gate portion, in a plan view, a direction from the second drain electrode to the second source electrode is defined as a first direction, and a direction orthogonal to the first direction is defined as a second direction, a length of the first channel in the first direction is equal to a length of the second channel in the first direction, and a length of the first channel in the second direction is equal to a length of the second channel in the second direction.

10. The drive circuit according to claim 9, wherein:

the second transistor further includes:

a first gate insulating film provided between the first channel and the first gate portion, and a second gate insulating film provided between the second channel and the second gate portion, and the second gate insulating film has a stack of an insulating layer that is identical to the first gate insulating film, and an insulating layer that is different from the first gate insulating layer.

11. The drive circuit according to claim 8, wherein the connection electrode is formed in a same conductive layer as the second drain electrode.

12. An active matrix substrate comprising:

the drive circuit according to claim 8; and a substrate on which the drive circuit is located.

13. A display device comprising:

the drive circuit according to claim 8;

a substrate on which the drive circuit is located; and a counter substrate located facing the substrate.

* * * * *